United States Patent [19]
Willems et al.

[11] Patent Number: 5,172,072
[45] Date of Patent: Dec. 15, 1992

[54] HIGH EFFICIENCY HARMONIC INJECTION POWER AMPLIFIER

[75] Inventors: David A. Willems, Salem; Edward L. Griffin, Roanoke; Inder J. Bahl, Roanoke; Michael D. Pollman, Roanoke, all of Va.

[73] Assignee: ITT Corporation, New York, N.Y.

[21] Appl. No.: 756,080

[22] Filed: Sep. 6, 1991

[51] Int. Cl.⁵ .............................................. H03F 1/26
[52] U.S. Cl. .................................... 330/149; 330/151
[58] Field of Search ...................... 307/520, 521, 522; 330/107, 124 R, 126, 149, 151, 295

[56] References Cited

U.S. PATENT DOCUMENTS 4,394,624  7/1983  Bauman .......................... 330/149 X
4,531,098  7/1985  Reed ............................... 330/149 X Primary Examiner—Steven Mottola
Attorney, Agent, or Firm—Arthur L. Plevy

[57] ABSTRACT

A high efficiency harmonic injection power amplifier has a power amplifier circuit, and at least a second-harmonic termination circuit which is coupled in parallel with the power amplifier circuit so to sample a small portion of the input signal and to inject into the power output signal an amplified harmonic signal which is phase-shifted for proper harmonic termination. The second-harmonic termination circuit includes a frequency multiplier for multiplying the frequency of the sampled input signal to twice the fundamental frequency, i.e., to $2f_o$, an amplifier for amplifying the $2f_o$ signal to the level of the corresponding harmonic component of the power amplifier output signal, and a phase shifter for shifting the phase of the second-harmonic signal for proper harmonic termination. Additional harmonic termination circuits may be provided for terminating third- and higher-order harmonics.

5 Claims, 1 Drawing Sheet

HIGH EFFICIENCY HARMONIC INJECTION POWER AMPLIFIER

FIELD OF INVENTION

The present invention relates to power amplifiers, and particularly, to high efficiency power amplifiers with provision for harmonic termination.

BACKGROUND OF INVENTION

Power amplifiers have traditionally been built as class-A and class-B for linear operation and class-C, D, E, F, and S for nonlinear operations. A primary goal of power amplifier design is to obtain a high power conversion efficiency from the DC power supply to the amplified wave output. An advantage of using the nonlinear classes is that their power-added efficiencies (PAE) tend to be higher. The PAE is a measure of how well the DC power is converted into RF or microwave power. Higher efficiencies are required in systems to preserve DC power (battery life), particularly in air borne and space borne systems, or where heat extraction is a problem, for example, in active array radar.

All of the nonlinear classes of power amplifiers generate harmonics. These harmonics must be properly terminated to prevent power from escaping the amplifier at frequencies other than the fundamental frequency. Additionally, the harmonics must be terminated at the proper phase, or the amplifier cannot operate at maximum efficiency. For example, the class-F amplifiers require the even order harmonics to be shorted and the odd order harmonics to be opened at the output of the power device. It is an extremely difficult problem to maintain the proper phase of the harmonic termination over more than the narrowest bandwidth at high frequencies, since these amplifiers generally use passive filter networks to provide the harmonic terminations.

In FIG. 2, an example of a power amplifier of the prior art is shown with harmonic termination using bandpass filters. The circuit, called a "harmonic reaction amplifier", is composed of two FETs in a configuration similar to a balanced amplifier. A second-harmonic transmission path is constructed between the FETs output terminals in each direction using bandpass filters BPF at the second-harmonic frequency ($2f_o$, twice the fundamental frequency). The main signal output paths and second-harmonic path are designed to have matched impedance characteristics with the FETs output impedances in the fundamental frequency and in the second-harmonic frequency band, respectively. A large second-harmonic component generated at the output of each FET flows into the second-harmonic path, and is used to inject a second-harmonic component into the other FET, without reflection. Assuming the FETs have the same operating characteristics, a second-harmonic standing wave is excited along the second-harmonic path, and the second-harmonic path length is set so as to locate a voltage null point at both FET output points. This condition coincides with the output second-harmonic terminating condition in the class-F amplifier. However, this circuit is limited to the narrow bandwidth of the bandpass filters selected for a particular fundamental frequency band, in this case the 1-2 GHz microwave band, and cannot be used for a wide range of frequencies. The operation of the harmonic reaction amplifier is explained in more detail in the article "High Efficiency Microwave Harmonic Reaction Amplifier", by T. Nojima and S. Nishiki, 1988 IEEE MTT-S Digest, pp. 1007–1010.

SUMMARY OF INVENTION

It is therefore a principal object of the invention to provide a high efficiency power amplifier with harmonic termination over a wide band of frequencies. It is a further object is to provide for harmonic termination for harmonic orders above the second-harmonic frequency as well.

These objects are achieved in the present invention by providing a power amplifier in which harmonic termination is accomplished by active injection of a harmonic signal amplified to the level approximating the corresponding harmonic in the power amplifier output and phase-shifted for proper termination.

In accordance with the invention, a high efficiency harmonic injection power amplifier comprises: a power amplifier circuit for amplifying an input signal to a power output signal having a fundamental frequency $f_o$; and at least a second-harmonic termination circuit which is coupled in parallel with the power amplifier circuit so to sample a small portion of the input signal and to inject into the power output signal an amplified harmonic signal which is phase-shifted for proper harmonic termination, wherein said second-harmonic termination circuit includes a frequency multiplier for multiplying the frequency of the sampled input signal to twice the fundamental frequency, i.e., $2f_o$, a second amplifier for amplifying the $2f_o$ signal to a level approximating a corresponding harmonic component in the power amplifier output signal, and a phase shifter for shifting the phase of the second-harmonic signal relative to the phase of the corresponding harmonic component in the power amplifier output signal for proper termination thereof. Additional harmonic termination circuits may be provided in parallel with the power amplifier circuit for terminating third- and higher-order harmonics as well.

BRIEF DESCRIPTION OF DRAWINGS

The above objects and further features and advantages of the invention are described in detail below in conjunction with the drawings, of which.

DETAILED DESCRIPTION OF PREFERRED EMBODIMENTS

Figure 1:
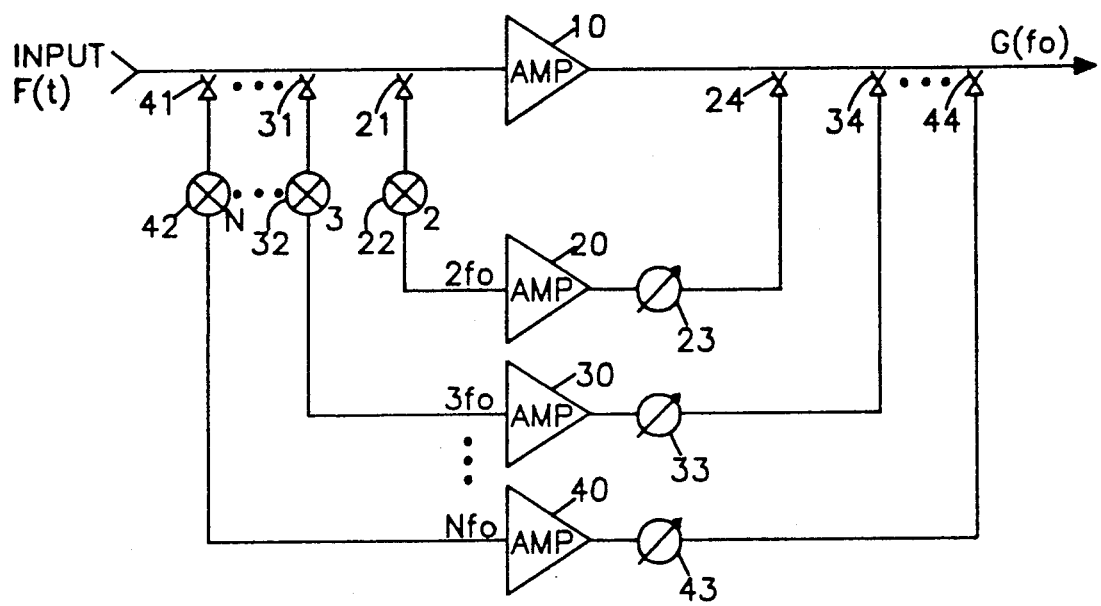
FIG. 1 is a schematic diagram of a high efficiency harmonic injection power amplifier in accordance with the invention using active injection of an amplified, phase-shifted harmonic signal for harmonic termination.
Figure 2:
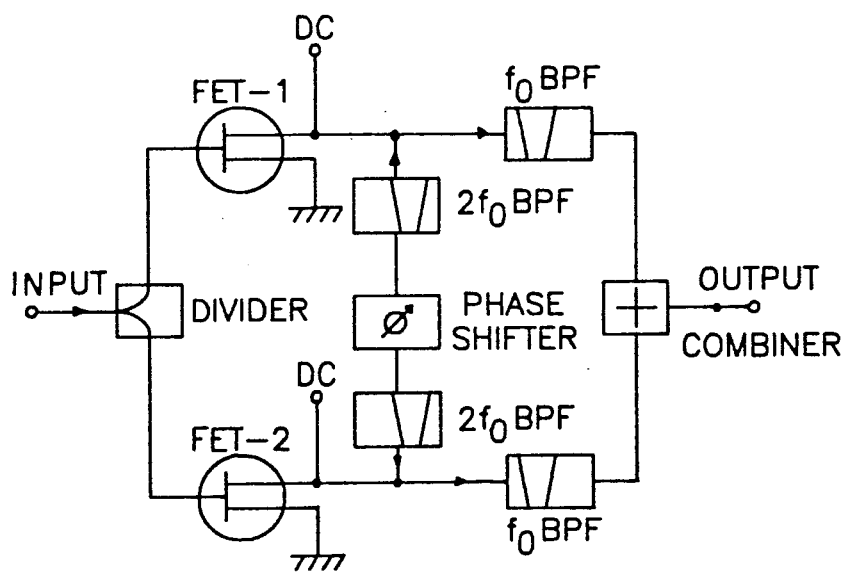
FIG. 2 is schematic diagram of a power amplifier of the prior art using passive bandpass filtering of harmonic components of the power output signal for harmonic termination.

Referring to FIG. 1, a high efficiency harmonic injection power amplifier has a power amplifier circuit with an amplifier 10 for amplifying an input signal F(t) to a power output signal G having a fundamental frequency $f_o$. At least a second-harmonic termination circuit is coupled in parallel with the power amplifier circuit so to sample a small portion of the input signal and to actively inject an amplified harmonic signal into the power output signal which is phase-shifted for proper harmonic termination. The second-harmonic termination circuit includes an input coupling 21 for taking a small portion of the input signal, such as a resistor bridge and the like, a frequency multiplier 22 for multiplying the frequency of the sampled input signal by an order of 2 to twice the fundamental frequency, i.e., $2f_o$, a second amplifier 20 for amplifying the $2f_o$ signal to a level approximating a corresponding harmonic component in the power amplifier output signal, a phase shifter 23 for adjusting the phase of the second-harmonic signal relative to the phase of the corresponding harmonic component in the power amplifier output signal for proper termination thereof, and an output coupling 24 which is impedance-matched to the output side of the power amplifier 10.

Similar third- and higher-order N harmonic termination circuits, having respective input couplings 31, 41, frequency multipliers 32, 42, amplifiers 30, 40, phase shifters 33, 43, and output couplings 34, 44, may be provided in parallel with the power amplifier circuit for terminating third- and higher-order harmonics as well.

The described amplifier design with active harmonic termination is practical because the power required for the second harmonic injection is approximately 10 dB less than the power required for the fundamental frequency. The third harmonic power will be approximately 20 dB lower than the fundamental power, and so on for higher-order harmonics.

Testing of the active harmonic injection technique was carried out for second harmonic termination. A typical test was for 2.5 mm FETs and a fundamental frequency of $f_o=1.5$ GHz. The FETs (or DUTs) were tuned to provide the maximum efficiency power output. Then the second-harmonic injection signal was added to the output, and the phase of the signal was varied until a peak efficiency was reached. A dramatic improvement in efficiency was demonstrated in the tests. Examples of the test results are shown in the following Table I:

TABLE I

| 2f Harmonic Level (−dBc) | P(out) (Watts) | $I_{ds}$ (% $I_{dss}$) | Eff$_{add}$ (%) | $I_{ds}$ mA |
| --- | --- | --- | --- | --- |
| −0 | 0.851 | 5% | 62% | 131 |
| −9 (0.107w) | 1.148 | 5% | 81% | 137 |
| −12 (0.054w) | 1.023 | 5% | 75% | 133 |
| −15 (0.027w) | 0.977 | 5% | 72% | 132 |
| −0 | 0.955 | 10% | 59% | 158 |
| −9 (0.123w) | 1.259 | 10% | 84% | 147 |
| −12 (0.062w) | 1.148 | 10% | 77% | 147 |
| −15 (0.031w) | 1.096 | 10% | 72% | 151 |
| −0 | 0.977 | 25% | 55% | 174 |
| −9 (0.123w) | 1.259 | 25% | 62% | 202 |
| −12 (0.062w) | 1.230 | 25% | 74% | 166 |
| −15 (0.031w) | 1.122 | 25% | 67% | 163 |

The active harmonic injection technique is particularly suitable for high frequencies (microwave) where passive harmonic termination may be unfeasible. The power amplifier of the invention is especially advantageous for wideband, high-efficiency power amplifier applications. It can be readily adjusted for maximum power conversion efficiency by electronic phase shifting of the harmonic injection signal(s). The harmonic injection power amplifier can provide a wider bandwidth than any of the conventional techniques.

The specific embodiments of the invention described herein are intended to be illustrative only, and many other variations and modifications may be made thereto in accordance with the principles of the invention. All such embodiments and variations and modifications thereof are considered to be within the scope of the invention, as defined in the following claims.

We claim:

1. A high efficiency harmonic injection power amplifier comprising:

a power amplifier circuit for amplifying an input signal to a power output signal having a fundamental frequency $f_o$; and at least a second-harmonic termination circuit which is coupled in parallel with the power amplifier circuit so to sample a small portion of the input signal and to inject into the power output signal an amplified harmonic signal which is phase-shifted for proper harmonic termination, wherein said second-harmonic termination circuit includes a frequency multiplier for multiplying the frequency of the sampled input signal to twice the fundamental frequency, i.e., $2f_o$, a second amplifier for amplifying the $2f_o$ signal to a level approximating a corresponding harmonic component in the power amplifier output signal, and a phase shifter for shifting the phase of the second-harmonic signal relative to the phase of the corresponding harmonic component in the power amplifier output signal for proper termination thereof.

2. A high efficiency harmonic injection power amplifier according to claim 1, further comprising a third-harmonic termination circuit which includes a frequency multiplier for multiplying the frequency of the sampled input signal to three times the fundamental frequency, i.e., $3f_o$, a third amplifier for amplifying the $3f_o$ signal to a level approximating a corresponding harmonic component in the power amplifier output signal, and a phase shifter for shifting the phase of the third-harmonic signal relative to the phase of the corresponding harmonic component in the power amplifier output signal for proper termination thereof.

3. A high efficiency harmonic injection power amplifier according to claim 1, further comprising an N-harmonic termination circuit, N being a positive integer greater than 2, which includes a frequency multiplier for multiplying the frequency of the sampled input signal to N times the fundamental frequency, i.e., $Nf_o$, an Nth amplifier for amplifying the $Nf_o$ signal to a level approximating a corresponding harmonic component in the power amplifier output signal, and a phase shifter for shifting the phase of the Nth-harmonic signal relative to the phase of the corresponding harmonic component in the power amplifier output signal for proper termination thereof.

4. A high efficiency harmonic injection power amplifier according to claim 1, wherein the power required for the second amplifier for the second harmonic injection is approximately 10 dB less than the power required for the power amplifier for the fundamental frequency.

5. A high efficiency harmonic injection power amplifier according to claim 2, wherein the power required for the third amplifier for the third harmonic injection is approximately 20 dB less than the power required for the power amplifier for the fundamental frequency.

* * * * *